(12) United States Patent
Magcale (10) Patent No.: US 12,507,375 B2
(45) Date of Patent: Dec. 23, 2025

(54) LIQUID BASED COOLING SYSTEMS AND METHODS FOR SERVER RACKS IN DATA CENTERS

(71) Applicant: Arnold Castillo Magcale, Danville, CA (US)

(72) Inventor: Arnold Castillo Magcale, Danville, CA (US)

(73) Assignee: UltraScale Digital Infrastructure, Inc., San Ramon, CA (US)

( * ) Notice: Subject to any disclaimer, the term of this patent is extended or adjusted under 35 U.S.C. 154(b) by 0 days.

(21) Appl. No.: 18/296,528

(22) Filed: Apr. 6, 2023

(65) Prior Publication Data

US 2024/0215198 A1    Jun. 27, 2024

Related U.S. Application Data

(63) Continuation of application No. 18/146,473, filed on Dec. 27, 2022.

(51) Int. Cl.
*H05K 7/20* (2006.01)

(52) U.S. Cl.
CPC ..... *H05K 7/20236* (2013.01); *H05K 7/20263* (2013.01); *H05K 7/20272* (2013.01); *H05K 7/20772* (2013.01)

(58) Field of Classification Search
None
See application file for complete search history.

(56) References Cited

U.S. PATENT DOCUMENTS

| | | | | |
|---|---|---|---|---|
| 10,212,849 | B2* | 2/2019 | Matsumoto | H05K 7/20272 |
| 11,026,344 | B2* | 6/2021 | Midgley | G06F 1/20 |
| 11,064,626 | B1* | 7/2021 | Salmon | H05K 7/1487 |
| 11,304,340 | B2* | 4/2022 | Chen | H05K 7/20781 |
| 11,490,546 | B2* | 11/2022 | Edmunds | H05K 7/20772 |
| 11,516,943 | B2* | 11/2022 | Bilan | H05K 7/20236 |
| 11,516,948 | B2* | 11/2022 | Navarro | H05K 7/20172 |
| 11,523,543 | B1* | 12/2022 | Salmon | G06F 1/20 |
| 11,678,462 | B2* | 6/2023 | Sweeney | H02B 1/20 |
| | | | | 361/622 |

(Continued)

*Primary Examiner* — Courtney L Smith
(74) *Attorney, Agent, or Firm* — Michael D. Eisenberg; MDE Patents (57) ABSTRACT

Embodiments disclosed include systems and methods for cooling heat generating electronic components of servers, and more particularly data-centers. Embodiments disclosed comprise vertically stacked immersive pods each comprising a plurality of motherboards, in a container rack/cabinet or alternatively a plurality of mother boards in a fully sealed container rack/cabinet, a vented front door, coolant distribution means from a coolant distribution unit (CDU) and a rear door heat exchange (RDHX) all operatively coupled to each other. Preferred embodiments include an additional heat exchanger comprising the coolant distribution unit in a closed loop configuration and operational coupled to another coolant distribution unit in an open loop configuration. Embodiments disclosed include a container rack/cabinet comprising a vented front door and vertically stacked immersion tanks/pods enabled by a hydraulic rail system. In preferred embodiments, fluid inlet valve and fluid outlet valve are operatively connected to the coolant distribution unit (CDU) comprised in the heat exchanger.

1 Claim, 9 Drawing Sheets

(56) References Cited

U.S. PATENT DOCUMENTS

| | | | | |
|---|---|---|---|---|
| 2011/0132579 A1* | 6/2011 | Best | ................... | H05K 7/20836 |
| | | | | 165/104.31 |
| 2014/0301037 A1* | 10/2014 | Best | ................... | H05K 7/20781 |
| | | | | 29/857 |
| 2016/0234970 A1* | 8/2016 | Shelnutt | ............. | H05K 7/20818 |
| 2021/0120705 A1* | 4/2021 | Enright | .................. | H05K 7/203 |
| 2022/0046822 A1* | 2/2022 | Gao | ..................... | H05K 7/1488 |
| 2022/0279674 A1* | 9/2022 | Manousakis | ....... | H05K 7/20818 |
| 2023/0106883 A1* | 4/2023 | Gao | ................... | H05K 7/20772 |
| | | | | 62/3.2 |
| 2023/0180439 A9* | 6/2023 | Enright | ............. | H05K 7/20818 |
| | | | | 361/700 |
| 2024/0292573 A1* | 8/2024 | Kajitani | ............. | H05K 7/20836 |

\* cited by examiner

Fig. 9

LIQUID BASED COOLING SYSTEMS AND METHODS FOR SERVER RACKS IN DATA CENTERS

CROSS-REFERENCES TO RELATED APPLICATIONS

This application is a continuation of U.S. application Ser. No. 18/146,473 filed Dec. 27, 2022 which is hereby incorporated herein by reference in its entirety.

BACKGROUND

The term "data center" (also sometime referred to as a "server farm") loosely refers to a physical location housing one or more "servers." In some instances, a data center can simply comprise an unobtrusive corner in a small office. In other instances, a data center can comprise several large, warehouse-sized buildings enclosing tens of thousands of square feet and housing thousands of servers. The term "server" generally refers to a computing device connected to a computing network and running software configured to receive requests (e.g., a request to access or to store a file, a request to provide computing resources, a request to connect to another client) from client computing devices, includes PDAs and cellular phones, also connected to the computing network. Such servers may also include specialized computing devices called network routers, data acquisition equipment, movable disc drive arrays, and other devices commonly associated with data centers.

Typical commercially-available servers have been designed for air cooling. Such servers usually comprise one or more printed circuit boards having a plurality of electrically coupled devices mounted thereto. These printed circuit boards are commonly housed in an enclosure having vents that allow external air to flow into the enclosure, as well as out of the enclosure after being routed through the enclosure for cooling purposes. In many instances, one or more fans are located within the enclosure to facilitate this airflow.

"Racks" have been used to organize several servers. For example, several servers can be mounted within a rack, and the rack can be placed within a data center. Any of various computing devices, such as, for example, network routers, hard-drive arrays, data acquisition equipment and power supplies, are commonly mounted within a rack.

Data centers housing such servers and racks of servers typically distribute air among the servers using a centralized fan (or blower). As more fully described below, air within the data center usually passes through a heat exchanger for cooling the air (e.g., an evaporator of a vapor-compression cycle refrigeration cowling system (or "vapor-cycle" refrigeration), or a chilled water coil) before entering a server. In some data centers, the heat exchanger has been mounted to the rack to provide "rack-level" cooling of air before the air enters a server. In other data centers, the air is cooled before entering the data center.

In general, electronic components of higher performing servers dissipate correspondingly more power. However, power dissipation for each of the various hardware components (e.g., chips, hard drives, cards) within a server can be constrained by the power being dissipated by adjacent heat generating components, the airflow speed and airflow path through the server and the packaging of each respective component, as well as a maximum allowable operating temperature of the respective component and a temperature of the cooling air entering the server as from a data center housing the server. The temperature of an air stream entering the server from the data center, in turn, can be influenced by the power dissipation and proximity of adjacent servers, the airflow speed and the airflow path through a region surrounding the server, as well as the temperature of the air entering the data center (or, conversely, the rate at which heat is being extracted from the air within the data center).

In general, a lower air temperature in a data center allows each server component to dissipate a higher power, and thus allows each server to dissipate more power and operate at a level of hardware performance. Consequently, data centers have traditionally used sophisticated air conditioning systems (e.g., chillers, vapor-cycle refrigeration) to cool the air (e.g., to about 65° F.) within the data center for achieving a desired performance level. By some estimates, as much as one watt can be consumed to remove one watt of heat dissipated by an electronic component. Consequently, as energy costs and power dissipation continue to increase, the total cost of cooling a data center has also increased.

In general, spacing heat-dissipating components from each other (e.g., reducing heat density) makes cooling such components less difficult (and less costly when considering, for example, the cost of cooling an individual component in a given environment) than placing the same components placed in close relation to each other (e.g., increasing heat density). Consequently, data centers have also compensated for increased power dissipation (corresponding to increased server performance) by increasing the spacing between adjacent servers.

In addition, large-scale data centers have provided several cooling stages for cooling heat dissipating components. For example, a stream of coolant, e.g., water, can pass over an evaporator of a vapor-compression refrigeration cycle cooling system and be cooled to, for example, about 44° F. before being distributed through a data center for cooling air within the data center.

The power consumed by a chiller can be estimated using information from standards (e.g., ARI 550/590-98). For example, ARI 550/590-98 specifies that a new centrifugal compressor, an efficient and common compressor used in high-capacity chillers, has a seasonal average Coefficient-of-Performance ("COP") from 5.00 to 6.10, depending on the cooling capacity of the chiller. This COP does not include power consumed by an evaporative cooling tower, which can be used for cooling a condenser in the refrigeration cycle cooling system and generally has a COP of 70, or better. The combined COP for a typical system is estimated to be about 4.7.

According to some estimates, some state-of-the-art data centers are capable of cooling only about 150 Watts-per-square-foot, as opposed to cooling the more than about 1,200 Watts-per-square-foot that could result from arranging servers to more fully utilize available volume (e.g., closely spacing servers and racks to more fully utilize floor-to-ceiling height and floor space) within existing data centers. Such a low cooling capacity can significantly add to the cost of building a data center, since data centers can cost as much as about $250 per-square-foot to construct.

As the air-cooling example implies, commercially available methods of cooling have not kept pace with increasing server and data-center performance needs, or the corresponding growth in heat density. As a consequence, adding new servers to existing data centers has become difficult and complex given the effort expended to facilitate additional power dissipation, such as by increasing an existing data center's air conditioning capacity.

Various alternative approaches for cooling data centers and their servers, e.g., using liquid cooling systems, have met with limited success. For example, attempts to displace heat from a microprocessor (or other heat-generating semiconductor-fabricated electronic device component, collectively referred to herein as a "chip") for remotely cooling the chip have been expensive and cumbersome. In these systems, a heat exchanger or other cooling device, has been placed in physical contact (or close physical relation using a thermal-interface material) with the package containing the chip. These liquid-cooled heat exchangers have typically defined internal flow channels for circulating a liquid internally of a heat exchanger body. However, component locations within servers can vary from server to server. Accordingly, these liquid-cooling systems have been designed for particular component layouts and have been unable to achieve large-enough economies of scale to become commercially viable.

Immersion cooling of electronic components has been attempted in high-performance (e.g., computer gaming) applications, but has not enjoyed widespread commercial success. Previous attempts at immersion cooling has submerged some, and in some instances all, components mounted to a printed circuit hoard in a dielectric fluid using a hermetically sealed enclosure to contain the fluid. Such systems have been expensive, and offered by a limited number of suppliers. Large scale data centers generally prefer to use "commoditized" servers and tend to not rely on technologies with a limited number of suppliers.

Control systems have been used to increase cooling rates for a plurality of computers in response to increased computational demand. Even so, such control systems have controlled cooling systems that dissipate heat into the data center building interior air (which in turns needs to be cooled by air conditioning), or directly use refrigeration as a primary mode of heat dissipation. Refrigeration as a primary mode of cooling, directly or indirectly, requires significant amounts of energy.

Two-phase cooling systems have been attempted, but due to technical complexity, they have not resulted in cost-effective products or sufficiently low operating costs to justify investing in two-phase-cooling capital. Still other single- and two-phase cooling systems bring the coolant medium to an exterior of the computer, but reject heat to a cooling medium (e.g., air) external to the computer and within the data center (e.g., within a server room). Accordingly, each method of server or computer cooling currently employed or previously attempted have been prohibitively expensive and/or insufficient to meet increasing cooling demands of computing devices.

Indirectly, many researchers have tried to reduce the power of individual components such as the power supply and CPU. Although chips capable of delivering desirable performance levels while operating at a lower relative power have been offered by chip manufacturers, such chips have, to date, been expensive. Consequently, cooling approaches to date have resulted in one or more of a high level of electricity consumption, a large capital investment and an increase in hardware expense.

Therefore, there exists the need for an effective, efficient and low-cost cooling alternative for cooling electronic components, such as, for example, rack-mounted servers.

DETAILED DESCRIPTION

According to an embodiment, an apparatus for cooling a plurality of rack-mountable heat generating electronic components of servers comprises at least one tank defining an open interior volume, a coolant inlet for receiving a dielectric liquid coolant within the open interior volume, a coolant outlet for allowing the dielectric liquid coolant to flow from the open interior volume, the coolant inlet and the coolant outlet being fluidly coupled to each other. According to a preferred embodiment, the at least one tank comprises an open or openable side to receive at least one column comprising a plurality of rack-mountable heat generating electronic components, each of the rack-mountable heat generating components comprising a motherboard.

According to an embodiment, one or more mounting members are positioned within the interior volume and configured to mountably receive the plurality of rack-mountable heat generating components within the interior volume, wherein the mounting members are configured to hold each of the rack-mountable heat generating components in the at least one column horizontally, in a vertically stacked configuration, wherein each of the rack-mountable heat generating components are configured to connect to a computer network via the corresponding motherboard.

According to an embodiment, a volume of dielectric coolant is at least partially held in the at least one tank and comprises a multi-circuit fluid cooling apparatus.

According to a preferred embodiment, the vertically stacked rack-mountable heat generating components are mountably received in at least one column in the at least one tank, and are partially or completely submerged in the volume of the dielectric liquid coolant in the at least one tank for cooling the vertically stacked rack-mountable heat generating components.

According to an alternate embodiment, the vertically stacked rack-mountable heat generating components are thermally coupled to a rear door heat exchanger (RDHX) via the external fluid circuit. According to one embodiment, the multi-circuit fluid cooling apparatus comprises a dielectric liquid cooling apparatus, a secondary cooling apparatus comprising the rear door heat exchanger (RDHX), and a liquid-to-liquid or liquid-to-refrigerant heat exchanger. Preferably, the dielectric liquid cooling apparatus comprises a single or plurality of fluid velocity augmentation devices in the volume of dielectric liquid coolant in the at least one tank, wherein at least one pump, the coolant inlet, the coolant outlet, and the mounting members are configured such that the at least one pump moves at least a portion of the dielectric liquid coolant vertically across the rack mountable heat generating components in parallel flow with dielectric liquid coolant moved vertically across heat producing components on the vertically oriented motherboard of at least one other of the vertically oriented rack-mountable servers.

According to a preferred embodiment, each of the single or plurality of fluid velocity augmentation devices is configured to increase upward fluid velocity of flow of dielectric liquid coolant through the vertically stacked rack-mountable heat generating electronic components.

According to one embodiment, the volume of dielectric liquid coolant comprises at least one passage in the tank that is outside of the vertically stacked rack-mountable heat generating electronic components. Additionally, when the pump is operated to move the dielectric liquid coolant vertically across the heat generating electronic components, a circuit is formed in which a first portion of dielectric liquid coolant is moved vertically upward across the heat generating electronic components and then downward outside of the rack mountable heat generating electronic components in the at least one passage, while a second portion of the dielectric liquid coolant flows out of the tank and through the liquid-to-liquid or liquid-to-refrigerant rear door heat exchanger (RDHX).

In an additional alternate embodiment the liquid-to-liquid or liquid-to-refrigerant rear door heat exchanger is configured to transfer heat from the second portion of dielectric liquid coolant in the circuit to liquid or refrigerant moving in the secondary cooling apparatus. Additionally, the RDHX is configured to reject at least part of the heat transferred from the second portion of the dielectric liquid coolant.

Figure 1:
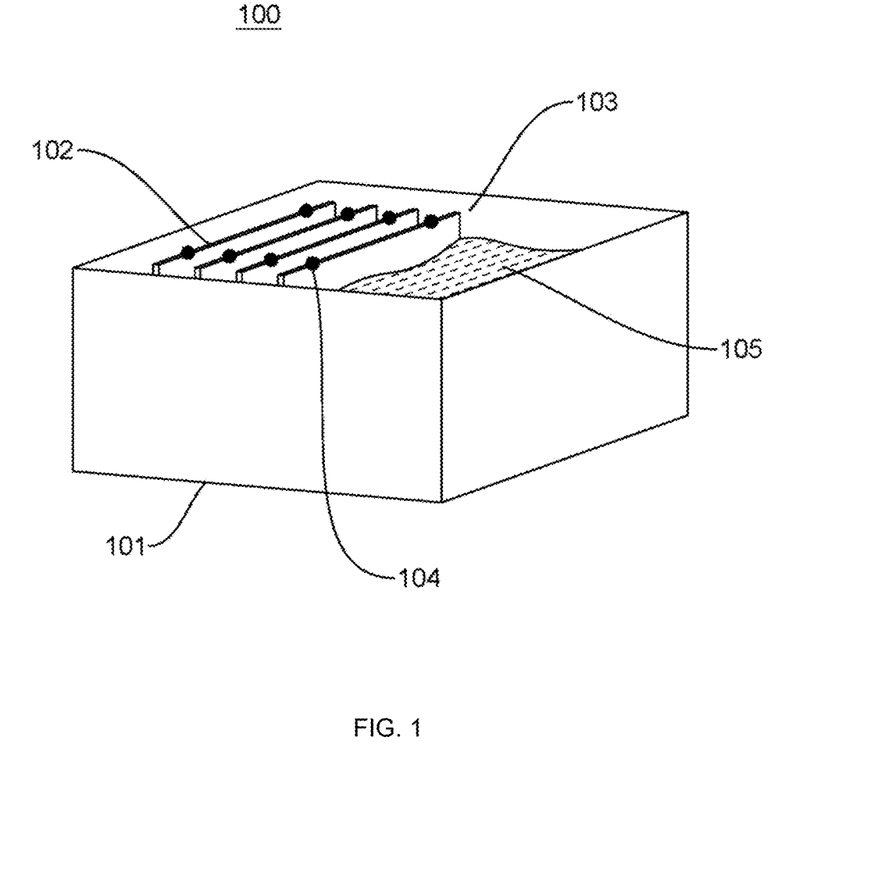
FIG. 1 illustrates a plurality of motherboards stacked in a liquid sealed immersive pod according to an embodiment.

FIG. 1 illustrates a plurality of motherboards stacked in a liquid sealed immersive pod according to an embodiment. FIG. 1 100 illustrates a top openable immersive pod 101 containing a plurality of stacked motherboards 102. The stacked motherboards comprises a provision for power connectivity 103 and communication capability 104. The immersive pod further contains dielectric liquid 105, wherein the dielectric liquid causes the motherboards to be partially or completely submerged.

Figure 2:
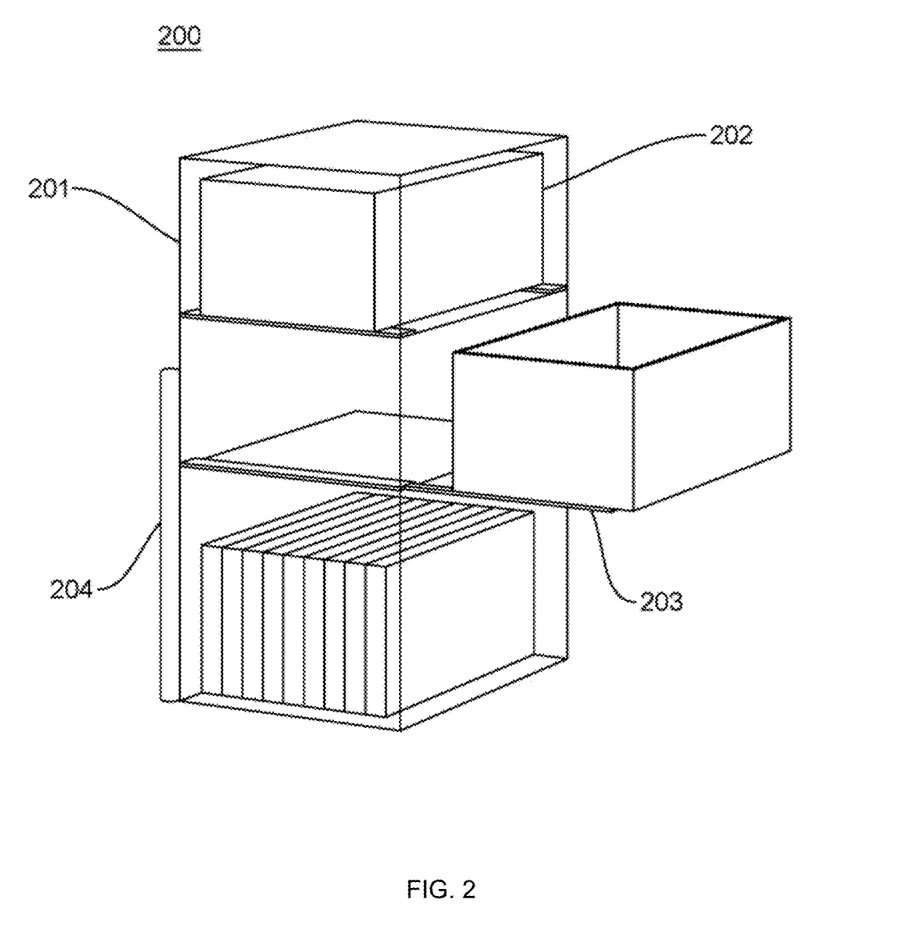
FIG. 2 illustrates a hydraulic rail system comprising immersive pods in a vertical cabinet according to an embodiment.

FIG. 2 illustrates a hydraulic rail system comprising immersive pods in a vertical cabinet according to an embodiment. FIG. 2 200 illustrates vertical cabinet 201 in a 42, 47, 48, 50 or 52 RU cabinet or rack configuration according to one embodiment. Other configurations are possible, and in some instances may be desirable, as would be apparent to a person having ordinary skill in the art. Fluid manifolds 204 may be implemented as primary, secondary or auxiliary cooling means. Immersive pods 202 are stacked vertically, enabled by hydraulic rail system 203.

Figure 3A:
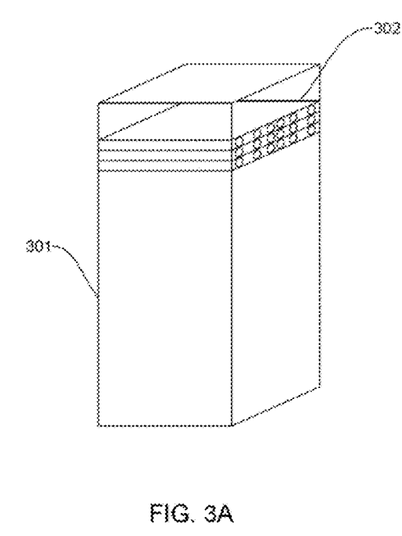
FIG. 3A illustrates a plurality of motherboards stacked in an immersive pod comprising dielectric liquid, in a vertical cabinet according to an embodiment.

FIG. 3A illustrates a plurality of motherboards stacked in an immersive pod comprising dielectric liquid, in a vertical cabinet according to an embodiment. FIG. 3A depicts vertical cabinet 301 and motherboards 302 stacked on top of each other.

Figure 3B:
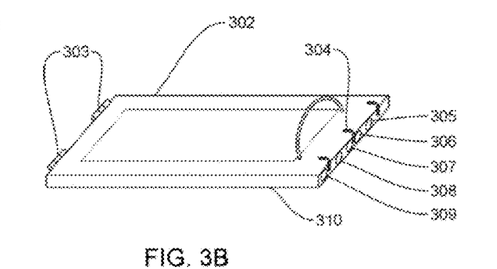
FIG. 3B illustrates a motherboard sealed inside a hinged casing according to an embodiment.

FIG. 3B illustrates a motherboard sealed inside a hinged casing according to an embodiment. Motherboard 302 is comprised in a sealed, openable casing comprising hinge 303 and locking mechanism 304. The sealed casing further comprises a power connection point 305 for the motherboard, a liquid inlet 306 and corresponding liquid outlet 307. Additionally and preferably, the sealed casing includes fiber optic connecting means 308 for the motherboard and copper RJ45 connecting means 309. Water tight seal 310 envelopes the sealed casing.

Figure 3C:
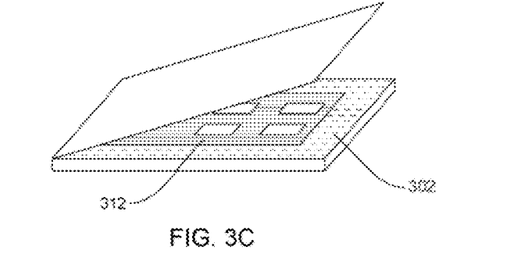
FIG. 3C illustrates the motherboard through the opened hinged casing.

FIG. 3C illustrates the motherboard through the opened hinged casing. Depicted in FIG. 3C is motherboard 302 and filled with liquid 311.

Figure 4:
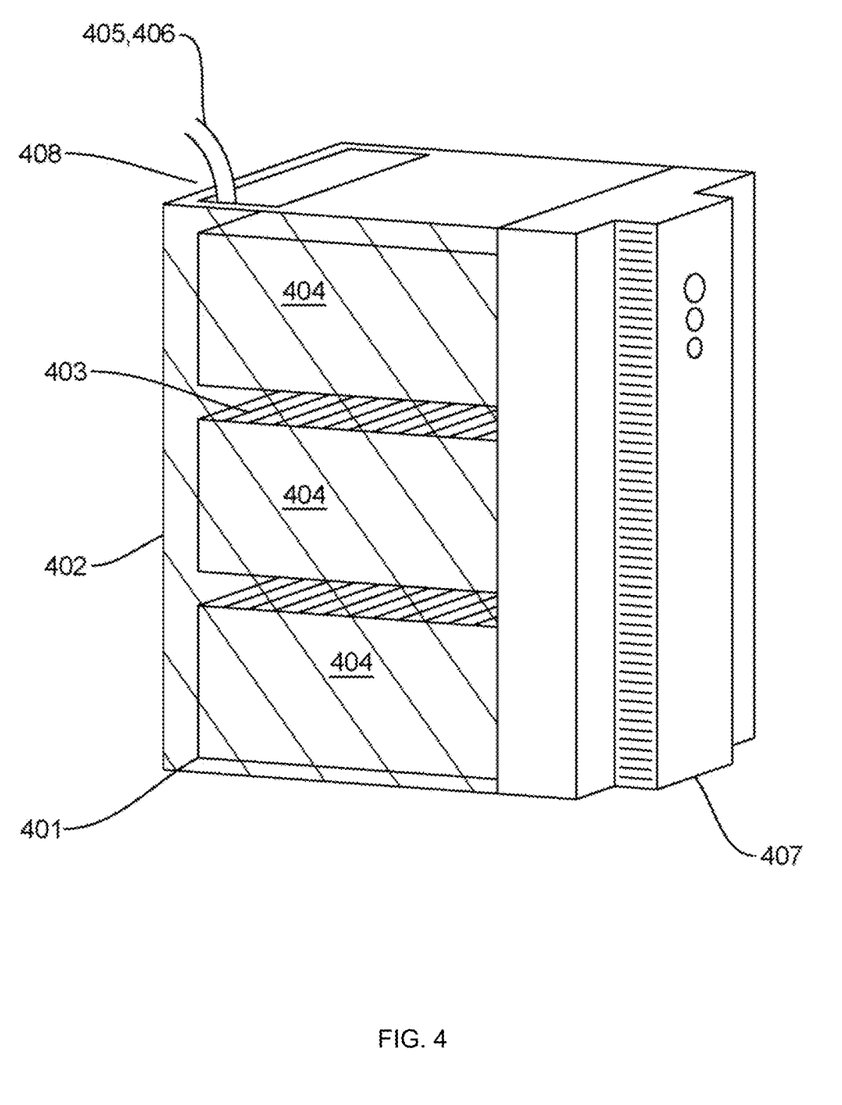
FIG. 4 illustrates a cabinet comprising vertically stacked immersive pods, a vented front door, coolant distribution means from a coolant distribution unit (CDU) and a rear door heat exchange (RDHX) all operatively coupled to each other according to an embodiment.

FIG. 4 illustrates a fully sealed cabinet comprising vertically stacked immersive pods, a vented front door, coolant distribution means from a coolant distribution unit (CDU) and a rear door heat exchange (RDHX) all operatively coupled to each other according to an embodiment.

FIG. 4 illustrates a fully sealed cabinet comprising vertically stacked immersive pods, a vented front door, coolant distribution means from a coolant distribution unit (CDU) and a rear door heat exchange (RDHX) all operatively coupled to each other according to an embodiment. FIG. 4 400 depicts container rack/cabinet 401 and further comprises vented front door 402. Immersion tanks/pods 404 stacked vertically and enabled by a hydraulic rail system, contain motherboards 403 immersed in dielectric liquid according to the illustrated embodiment. Yet additionally, fluid inlet valve 405 and fluid outlet valve 406 operatively connected to a coolant distribution unit (CDU) 408 enables cooling of the motherboards 403 contained in immersion pods 404. Alternatively and preferably, an embodiment includes rear door heat exchanger (RHX) 407 as a primary, secondary or auxiliary cooling unit.

Figure 5:
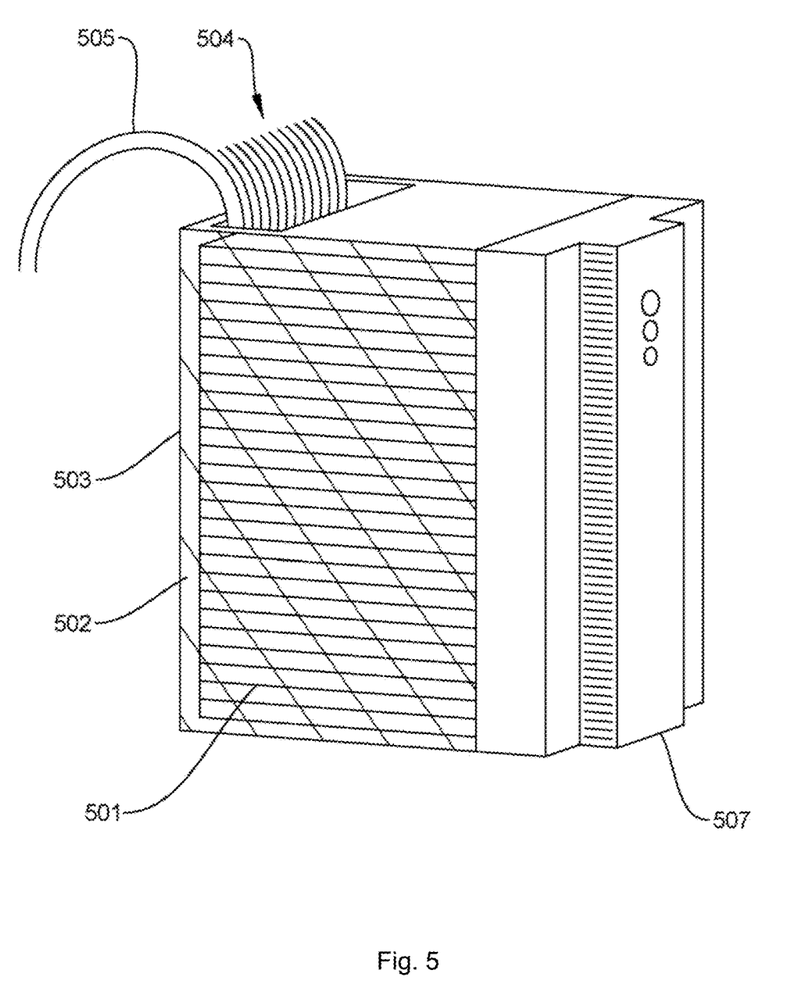
FIG. 5 illustrates a fully sealed cabinet comprising motherboards in liquid sealed units stacked on top of each other, a vented front door, coolant distribution means from a coolant distribution unit (CDU) and a rear door heat exchange (RDHX) all operatively coupled to each other according to an alternate embodiment.

FIG. 5 illustrates a fully sealed cabinet comprising motherboards in liquid sealed units stacked on top of each other, a vented front door, coolant distribution means from a coolant distribution unit (CDU) and a rear door heat exchange (RDHX) all operatively coupled to each other according to an alternate embodiment. According to the illustrated alternate embodiment, the system comprises liquid sealed units 501 containing 1 motherboard each, and vertically stacked on top of each other in a fully sealed cabinet 502. FIG. 5 further depicts vented front door 503, fluid inlet valves 504 and fluid outlet valves 505 connected to coolant distribution unit (CDU) 506. Alternatively and preferably, an embodiment includes rear door heat exchanger (RHX) 507 as a primary, secondary or auxiliary cooling unit.

Figure 6:
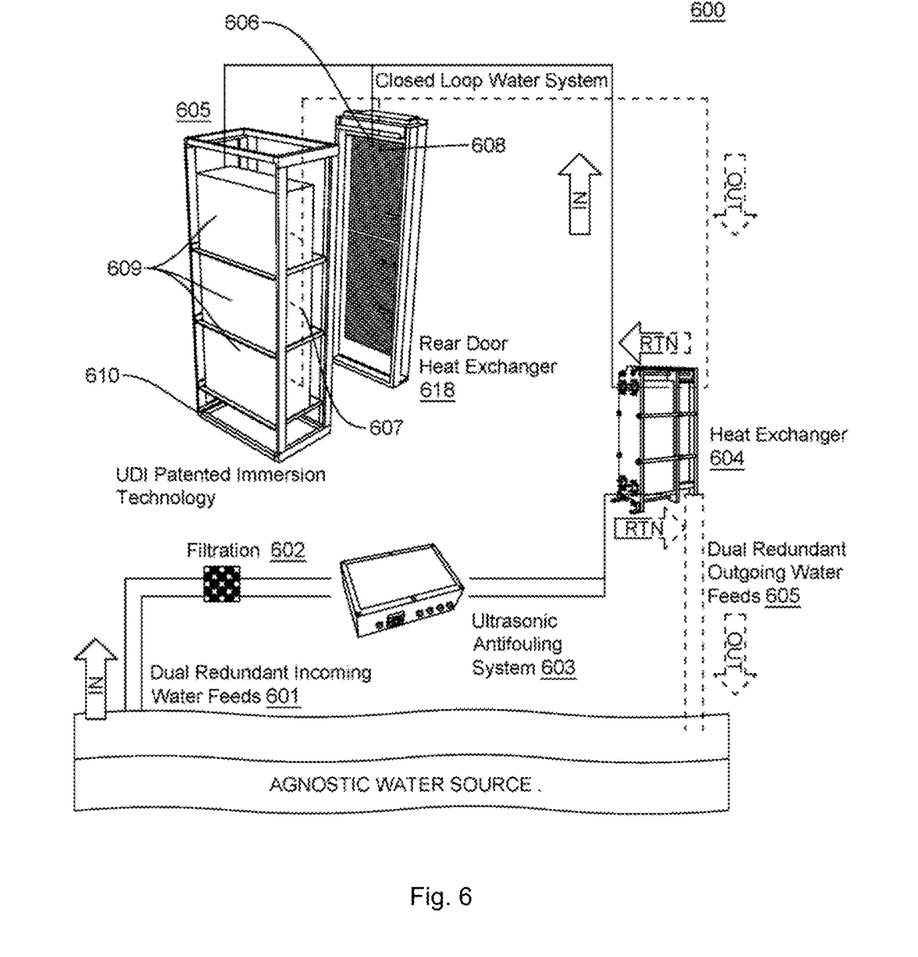
FIG. 6 illustrates the complete apparatus comprising some or all elements from FIGS. 1-5 for cooling a plurality of rack-mountable heat generating electronic components of servers according to an embodiment.
Figure 7:
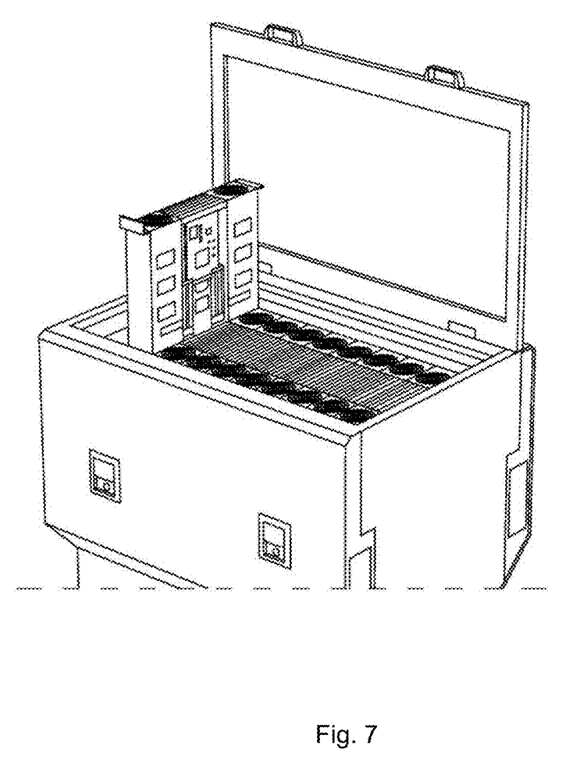
FIG. 7 illustrates an example embodiment of a data center single phase immersion cooling system.
Figure 8:
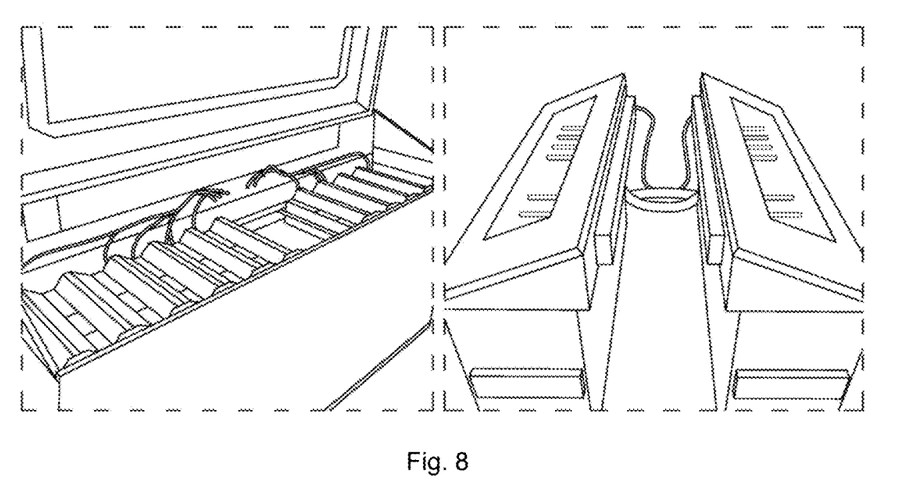
FIG. 8 illustrates an example embodiment of a data center two phase immersion cooling system.
Figure 9:
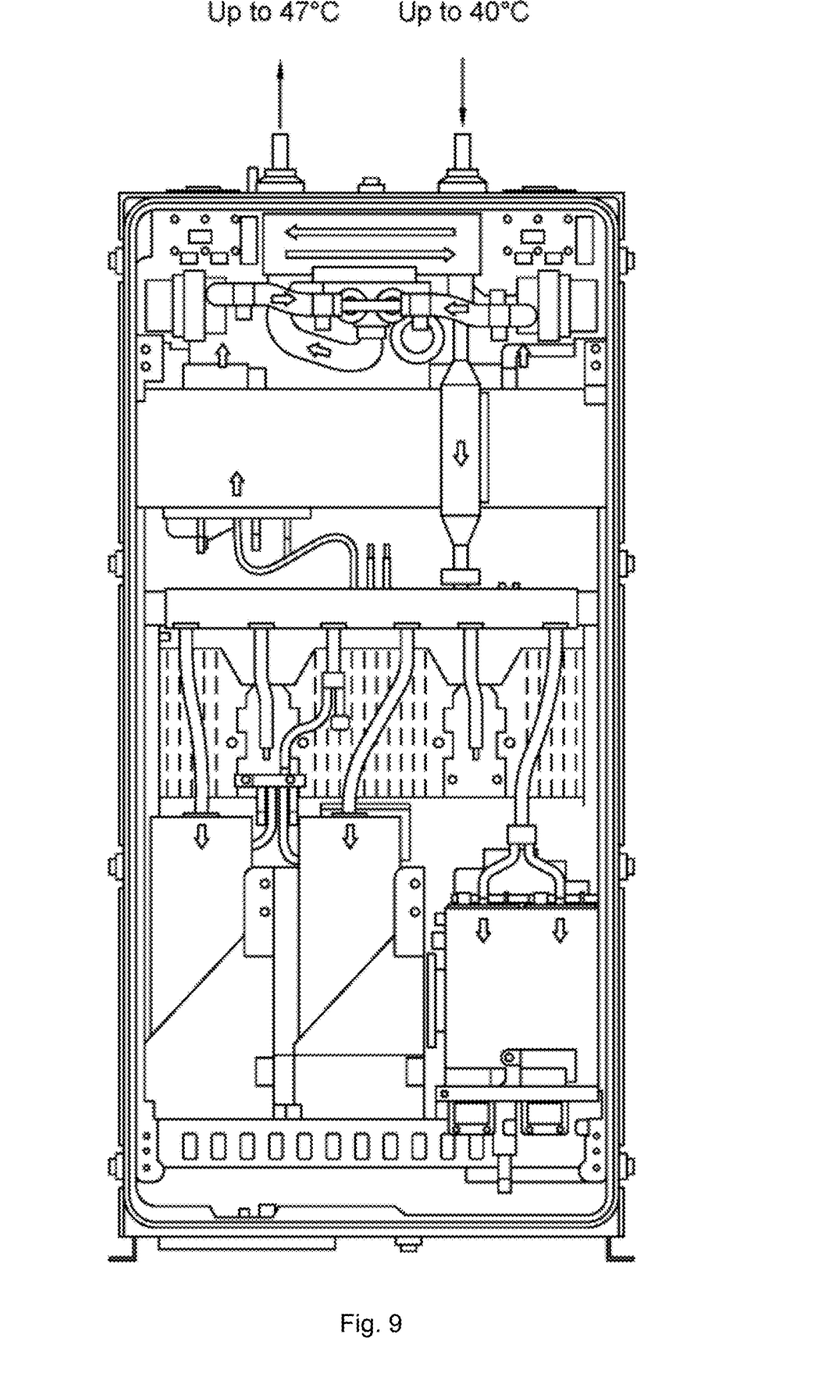
FIG. 9 illustrates an example embodiment of a data center cold plate direct to chip cooling system.

FIG. 6 illustrates the complete apparatus comprising some or all elements from FIGS. 1-5 for cooling a plurality of rack-mountable heat generating electronic components of servers in a water based cooling system, according to an embodiment. FIG. 6 600 illustrates an open loop water based cooling unit comprising filtration system 602 configured to receive water from dual redundant incoming water feeds 601 from an agnostic water source. Water from the filtration unit 602 an ultrasound antifouling system 603 before being circulated through a heat exchanger 604 through which the water is expelled through dual redundant water feeds 605. The heat exchanger 604 further comprises a closed loop water based cooling unit operatively coupled to rear door heat exchanger (RDHX) 611 and immersive pods 609 each containing a plurality of motherboards and vertically stacked in cabinet 610. The rear door heat exchanger circulates cold water through cold water inlets 605 and 606 through the immersive pods and the rear door heat exchanger respectively. And hot water outlets 607 and 608 from the immersive pods and the rear door heat exchanger respectively, circulate the hot water back through the heat exchanger for cooling, aided by the open loop cooling system connected to the agnostic water source. FIG. 7 illustrates an example embodiment of a data center single phase immersion cooling system. Immersion tanks/pods are stacked vertically, enabled by a hydraulic rail system, and contain motherboards immersed in dielectric liquid according to the illustrated embodiment. FIG. 8 illustrates an example embodiment of a data center two phase immersion cooling system. And FIG. 9 illustrates an example embodiment of a data center cold plate direct to chip cooling system. Water from the filtration unit is circulated through an ultrasound antifouling system before being circulated through the heat exchanger through which the water is expelled through dual redundant water feeds. The heat exchanger further comprises a closed loop water based cooling unit operatively coupled to rear door heat exchanger (RDHX) and immersive pods each containing a plurality of motherboards and vertically stacked in cabinet.

Embodiments disclosed include upscale and downscale modularity of design. According to one embodiment, the vertically stacked rack-mountable heat generating electronic components are mountable in the at least one tank such that, when the vertically stacked rack-mountable heat generating electronic components are commonly at least partially submerged in the volume of dielectric liquid coolant in the at least one tank and the dielectric liquid coolant is moved within the at least one tank, at least one of the vertically stacked rack-mountable heat generating electronic components are independently horizontally removable from the volume of dielectric liquid coolant in which the vertically stacked rack-mountable heat generating electronic components are commonly at least partially submerged and from the at least one tank through the upper portion of the tank while at least two of the other vertically stacked rack-mountable heat generating electronic components in the at least one column remain commonly at least partially submerged in the volume of dielectric liquid coolant in the at least one tank and the dielectric liquid coolant in the at least one tank continues to flow across heat generating electronic components of the at least two other vertically stacked rack-mountable heat generating electronic components remaining at least partially commonly submerged in the at least one column.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus, it will be understood by those skilled in the art of cooling systems and methods, and more particularly cooling systems and methods for data centers, that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed concurrently, or the blocks may sometimes be executed in the reverse order, depending upon the functionality involved.

The terminology used herein is for the purpose of describing embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any program nomenclature that follows is used merely for convenience, and thus the invention should not be limited to use solely in any specific application identified and/or implied by such nomenclature.

The present invention and some of its advantages have been described in detail for some embodiments. It should be understood that although the system and process are described with reference to cooling systems and methods for data centers, the system and method is highly reconfigurable, and may be used in other systems as well. Portions of the embodiment may be used to support cooling systems and methods for other types of data communication systems, residential buildings, offices, factories or/and facilities. Modifications of the embodiments may be used to capture emitted heat from heat sources and convert the captured heat to electricity to serve as an auxiliary or primary power source. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. An apparatus for cooling a plurality of rack-mountable heat-generating electronic components of servers, the apparatus comprising:
   two or more tanks defining an open interior volume and having:
   a coolant inlet for receiving a dielectric liquid coolant within the open interior volume;
   a coolant outlet for allowing the dielectric liquid coolant to flow from the open interior volume;
   the coolant inlet and the coolant outlet being fluidly coupled to each other;
   wherein the two or more tanks further comprise an open or openable side to receive:
   at least one column comprising the plurality of rack-mountable heat-generating electronic components, each of the rack-mountable heat-generating components comprising a motherboard;
   the plurality of rack-mountable heat-generating components mounted within the interior volume;
   wherein each of the rack-mountable heat-generating components is held in the at least one column horizontally, in a vertically stacked configuration;
   wherein the rack-mountable heat-generating components are configured to connect to a computer network via the corresponding motherboard;
   a volume of dielectric liquid coolant at least partially held in the two or more tanks and comprising:
   a coolant distribution unit (CDU) operatively connected to a rear door heat exchanger (RDHX):
   wherein the coolant inlet and the coolant outlet are configured such that:
   at least a portion of the dielectric liquid coolant is moved vertically across the rack-mountable heat-generating components in parallel flow;
   the dielectric liquid coolant moved vertically across heat-generating components on horizontally oriented motherboards of at least one of the servers;
   passage within the tank that is outside of the vertically stacked rack-mountable heat-generating electronic components, wherein:
   a first portion of the dielectric liquid coolant is moved vertically upward across the heat-generating electronic components and then downward outside of the rack-mountable heat-generating electronic components in the at least one passage;
   a second portion of the dielectric liquid coolant flows out of the tank and through the rear door heat exchanger;
   wherein the rear door heat exchanger is configured to: transfer heat from the second portion of dielectric liquid coolant in the circuit to liquid or refrigerant moving in the rear door heat exchanger; and is configured to reject at least part of the heat transferred from the second portion of the dielectric liquid coolant.

* * * * *